(12) United States Patent
Isobayashi

(10) Patent No.: US 8,816,472 B2
(45) Date of Patent: Aug. 26, 2014

(54) SEMICONDUCTOR DEVICE AND METHOD FOR MANUFACTURING THE SAME

(71) Applicant: Kabushiki Kaisha Toshiba, Tokyo (JP)

(72) Inventor: Atsunobu Isobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/909,665

(22) Filed: Jun. 4, 2013

(65) Prior Publication Data

US 2014/0110850 A1    Apr. 24, 2014

(30) Foreign Application Priority Data

Oct. 24, 2012    (JP) .................................. 2012-234699

(51) Int. Cl.
*H01L 21/764* (2006.01)
*H01L 29/40* (2006.01)

(52) U.S. Cl.
USPC ............ 257/522; 257/E21.573; 257/E21.581; 438/422

(58) Field of Classification Search
None
See application file for complete search history.

(56) References Cited

U.S. PATENT DOCUMENTS

| | | | |
|---|---|---|---|
| 6,376,330 B1 * | 4/2002 | Fulford et al. | 438/421 |
| 7,473,632 B2 | 1/2009 | Ueda | |
| 7,879,683 B2 * | 2/2011 | Al-Bayati et al. | 438/422 |
| 2002/0050651 A1 * | 5/2002 | Nakagawa et al. | 257/774 |
| 2004/0224493 A1 * | 11/2004 | Nakagawa et al. | 438/619 |
| 2005/0181604 A1 * | 8/2005 | Sperlich et al. | 438/671 |
| 2007/0099417 A1 * | 5/2007 | Fang et al. | 438/656 |
| 2011/0309517 A1 | 12/2011 | Miki et al. | |
| 2012/0313159 A1 * | 12/2012 | Sim | 257/324 |
| 2013/0214415 A1 * | 8/2013 | Pachamuthu et al. | 257/751 |

FOREIGN PATENT DOCUMENTS

JP    2008-021862 A    1/2008

OTHER PUBLICATIONS

"Interconnect", International Technology Roadmap for Semiconductors, 2011 Edition.*

* cited by examiner

*Primary Examiner* — Davienne Monbleau
*Assistant Examiner* — Joseph Schoenholtz
(74) *Attorney, Agent, or Firm* — Holtz Holtz Goodman & Chick PC

(57) ABSTRACT

According to one embodiment, a semiconductor device includes a first insulating film formed above a substrate, wires formed on the first insulating film, an air gap formed between the adjacent wires, and a second insulating film formed on the wires and the air gap. Each of the wires has a metal film formed on the first insulating film and a hard mask formed on the metal film, the hard mask has a first layer and a second layer, a second internal angle formed by the under surface and the side surface of the second layer on a cross section of the second layer is smaller than a first internal angle formed by the under surface and the side surface of the first layer on a cross section of the first layer, and the top surface of the air gap is higher than the top surface of the metal film.

21 Claims, 15 Drawing Sheets

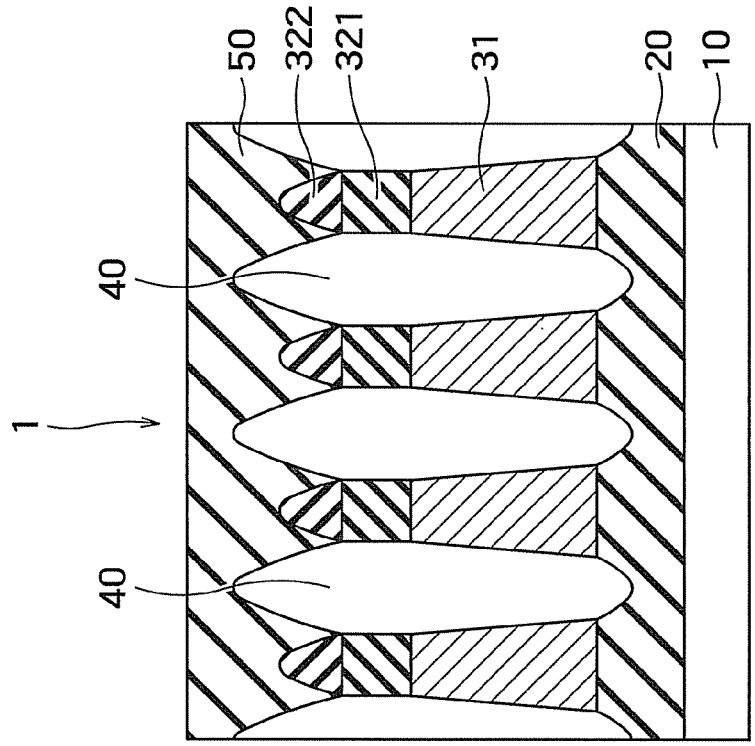
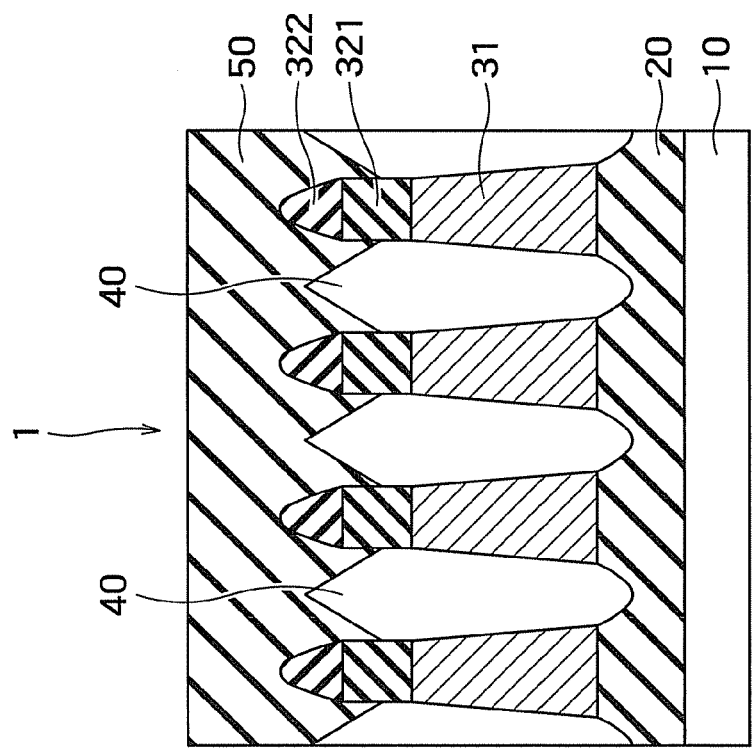

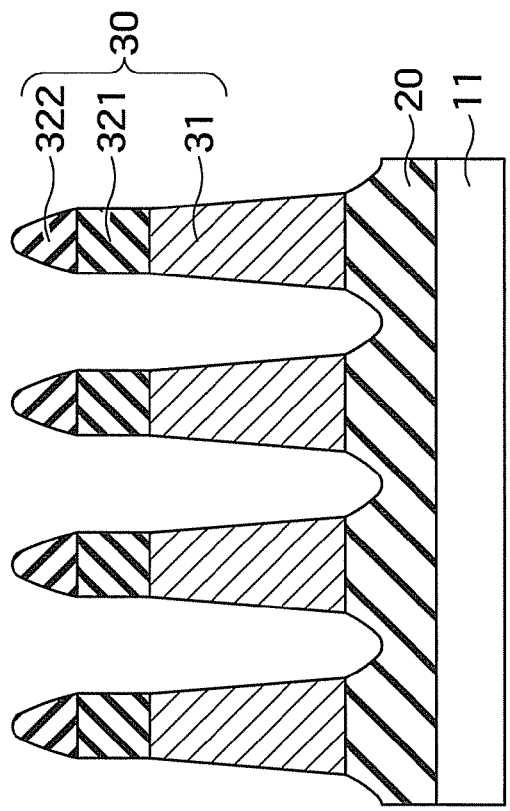
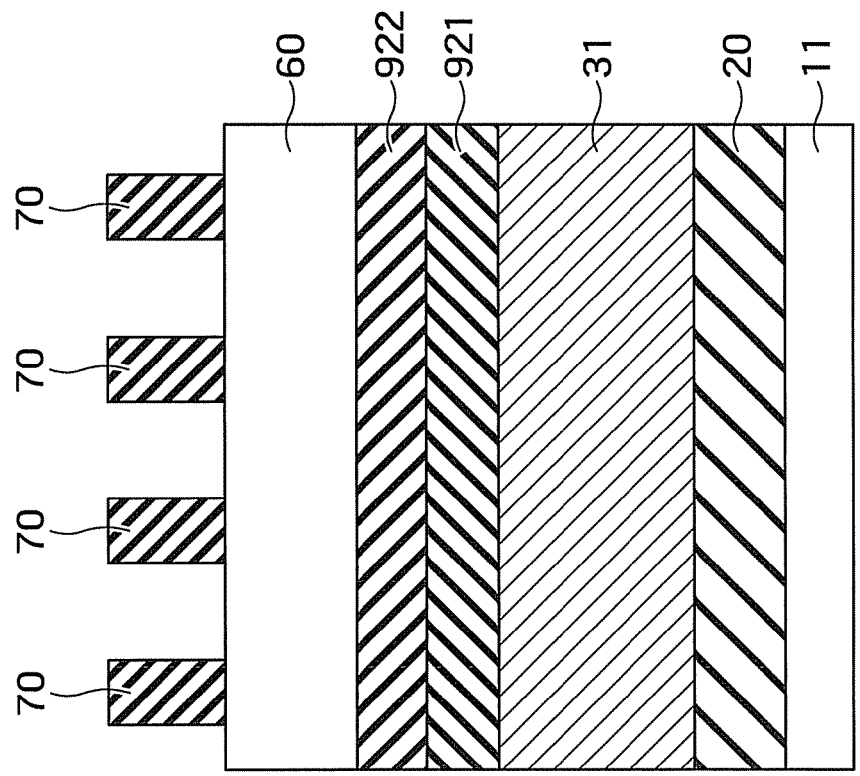
FIG. 3B
FIG. 3A

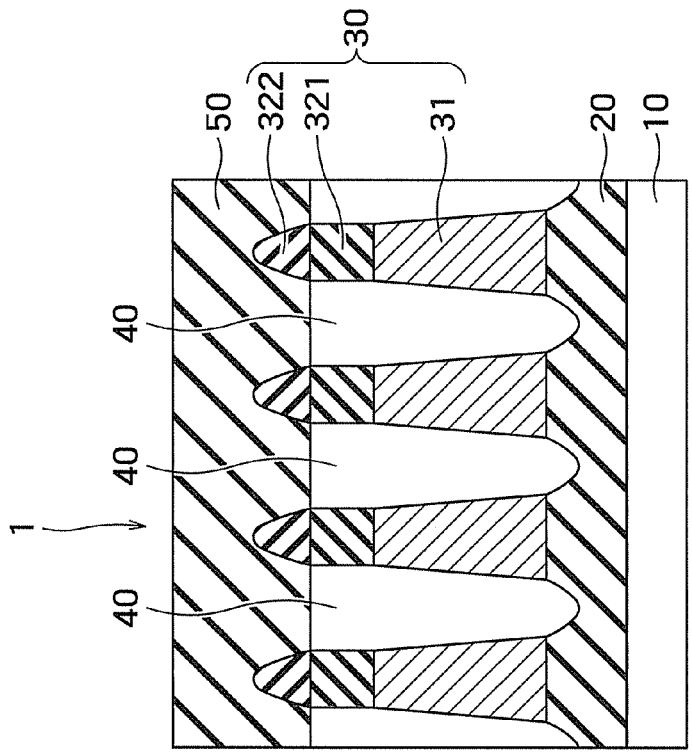
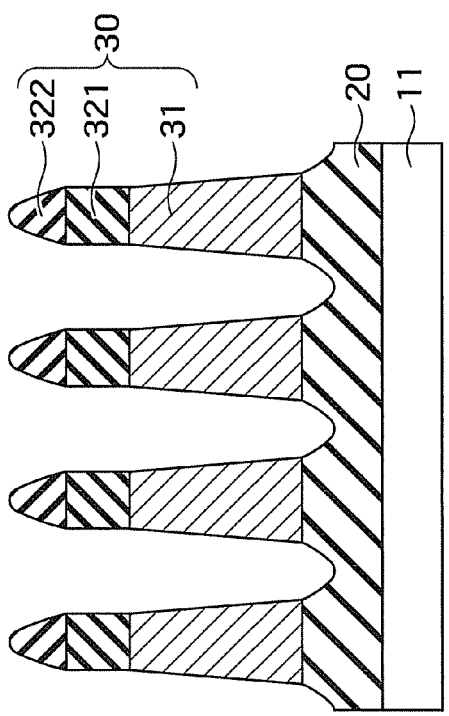

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2012-234699, filed on Oct. 24, 2012, the entire contents of which are incorporated herein by reference.

FIELD

Embodiments of the present invention relate to a semiconductor device and a method for manufacturing the same.

BACKGROUND

With a semiconductor device pattern becoming finer, problems have occurred where a capacitance between wires increases due to a fringe effect generated between the wires and the reliability of the wires deteriorates due to a reduced distance between the wires.

As a measure to avoid the above increase in capacitance between the wires, it has been proposed to introduce an air gap between the wires.

In the conventional proposal, the air gap has been formed as follows. Specifically, wires are first formed by the damascene process, that is, a groove is formed in an insulating film and is then filled with a metal film, to mold the metal film by use of the CMP (Chemical Mechanical Planarization) method, thereby forming a plurality of wires. Further, the insulating film located between the wires is removed by etching or the like, to form the air gap. When the air gap is formed as thus described, the top surface thereof is almost as high as the top surface of the wire.

BRIEF DESCRIPTION OF THE DRAWINGS

FIGS. 2A to 2E are sectional views (part 1) of modified examples of the semiconductor device according to the first embodiment;

FIGS. 3A to 3C are sectional views for explaining a manufacturing process of the semiconductor device according to the first embodiment;

FIGS. 9A and 9B are sectional views for explaining a manufacturing process of the semiconductor device according to the second embodiment;

DETAILED DESCRIPTION

In one embodiment, a semiconductor device includes a first insulating film formed above a semiconductor substrate, a plurality of wires formed on the first insulating film, an air gap formed between the adjacent wires, and a second insulating film formed on the wires and the air gap. In the semiconductor device, each of the wires has a metal film formed on the first insulating film and a hard mask formed on the metal film, the hard mask has a first layer formed on the metal film and a second layer formed on the first layer, a second internal angle formed by the under surface and the side surface of the second layer on a cross section of the second layer along a width of the wire is smaller than a first internal angle formed by the under surface and the side surface of the first layer on a cross section of the first layer along the width of the wire, and the top surface of the air gap is higher than the top surface of the metal film.

Hereinafter, embodiments will be described with reference to the drawings. However, the present invention is not restricted to these embodiments. It is to be noted that a portion in common throughout the drawings is provided with a common numeral, and a repeated description thereof will be omitted. Further, the drawings are schematic views for explaining the invention and promoting understanding thereof, and some places may have shapes, sizes, ratios or the like different from those of an actual device, but these can be appropriately subjected to design changes in light of the following description and known techniques.

However, wording "the same" and "almost the same" or "flat" and "almost flat" which are used for heights or surface shapes in the following description do not only mean the case of those being mathematically the same or mathematically (geometrically) flat, but also means the case of those being different or rough in an industrially allowable degree in a manufacturing process of a semiconductor device. Further, as for expressions regarding shapes, not only a shape showing a mathematically defined shape, but also a shape including a difference (error, distortion) in an industrially allowable degree in the manufacturing process of the semiconductor device is included as a shape similar to the above shapes.

First Embodiment

A semiconductor device 1 of the present embodiment will be described using FIG. 1. Although an example of application to multi-layered wires of a semiconductor storage device such as an NAND type flash memory or an MRAM (Magnetoresistive Random Access Memory) will be described here, the present invention is not restricted thereto, and can be applied to a variety of regions of other semiconductor devices.

Figure 1:
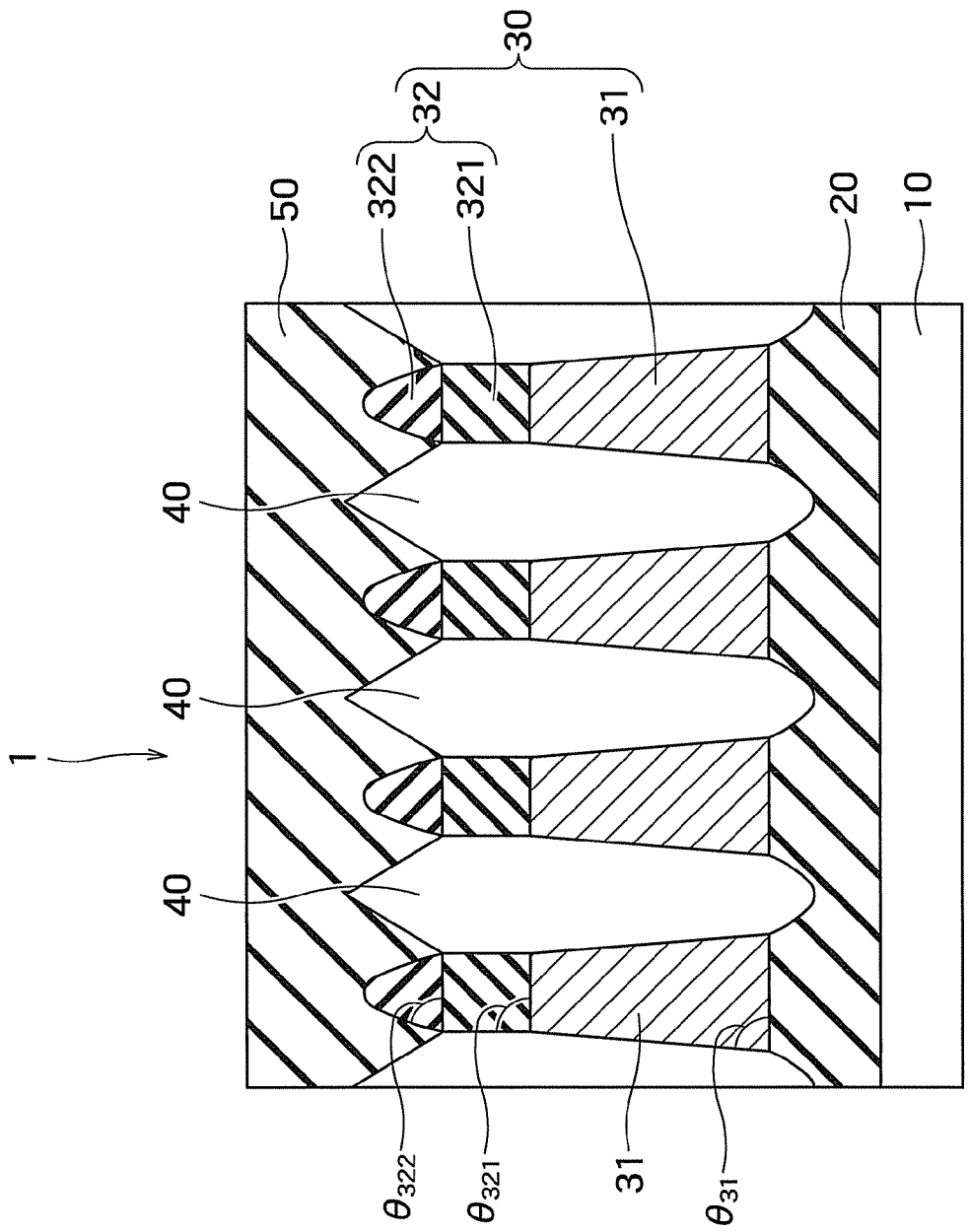
FIG. 1 is a sectional view of a semiconductor device according to a first embodiment.

FIG. 1 is one showing a cross section of a semiconductor device 1 according to the present embodiment, and is specifically one showing a cross section along a width of a wire 30 formed in the semiconductor device 1. As shown in FIG. 1, the plurality of wires 30 is formed at intervals of, for example, not larger than 30 nm on a first insulating film 20 formed above a semiconductor substrate 10. It is to be noted that this semiconductor substrate 10 may not necessarily be a silicon substrate, but may be another substrate. Further, it may be one where a structure of a semiconductor element and the like are formed on the variety of substrates as thus described. An air gap 40 is formed between each of adjacent wires 30, and a second insulating film 50 is formed on each wire 30 and each air gap 40.

Incidentally, although the wire 30 and the first insulating film 20 are directly in contact with each other on the under surface of the wire 30 in FIG. 1, this is not restrictive in the present embodiment, and those may be in contact with each other through a liner film or the like.

Further, each wire 30 has a metal film 31 formed on the first insulating film 20 and a hard mask 32 formed on the metal film 31, and the hard mask 32 is made up of a first layer 321 formed on the metal film 31 and a second layer 322 formed on the first layer 321. Although the hard mask 32 will be described as one having a double-layered structure in the present embodiment, this is not restrictive, and it may, for example, have a multi-layered structure with not less than three layers, or a single-layered structure.

Further, the metal film 31 has a thickness which is, for example, twice as large as a distance between the adjacent wires 30, the first layer 321 has a thickness which is, for example, not smaller than a half of the distance between the adjacent wires 30, and the second layer 322 has a thickness which is, for example, not smaller than a half of the distance between the adjacent wires 30. It should be noted that, although details will be described later, the first layer 321 preferably has the thickness not smaller than a half of the distance between the adjacent wires 30 for the sake of improvement in reliability of the wires 30.

The metal film 31 has a cross section (referring to a cross section cut along the width of the wire 30 in the following description) in the shape of a rectangle, a square, a trapezoid with an upper base shorter than a lower base, or the like, or in the shape similar thereto. It is to be noted that for the purpose of preventing the wire 30 from laterally falling, the cross section of the metal film 31 is preferably in the shape of the trapezoid with an upper base shorter than a lower base so as to increase a volume of the air gap 40 formed between the wires 30 while increasing a contact area of the wire 30 with the first insulating film 20. Further, the first layer 321 has a cross section in the shape of a rectangle, a square, a trapezoid with an upper base shorter than a lower base, or the like, or a shape similar thereto, and the second layer 322 has a cross section in the shape of a trapezoid with an upper base shorter than a lower base, a triangle, a semicircle with its diameter in a lower position (its diameter facing the first layer 321), or the like, or in the shape similar thereto.

Incidentally, in FIG. 1, lower base side internal angles (internal angles) of the metal film 31, the first layer 321 and the second layer 322 on the cross section are shown as $\theta_{31}$, $\theta_{321}$ and $\theta_{322}$. To describe this by using the case of the metal film 31, the lower base side internal angle refers to the angle $\theta_{31}$ formed by its bottom surface and its inclined side surface which is inclined (including the case of being vertical) to its lower surface in contact with the first insulating film 20. In the present embodiment, the lower base side internal angle $\theta_{322}$ of the second layer 322 is smaller than the lower base side internal angle $\theta_{321}$ of the first layer 321. Further, the lower base side internal angle $\theta_{321}$ of the first layer 321 is preferably the same as or larger than the lower base side internal angle $\theta_{31}$ of the metal film 31, and the lower base side internal angle $\theta_{322}$ of the second layer 322 is preferably smaller than the lower base side internal angle $\theta_{31}$ of the metal film 31.

Next, the air gap 40 will be described in detail. It is to be noted that in the following description, each region of the air gap 40 is called as follows. Assuming that the air gap 40, for example, has a cylindrical shape, the side surface of the air gap 40 which is in contact with or opposed to the wire layer 31 is referred to as the side surface of the air gap 40, the surface of the air gap 40 which is in contact with or opposed to the first insulating film 20 is referred to as an under surface of the air gap 40, and the surface of the air gap 40 which is in contact with the second insulating film 50 is referred to as the top surface of the air gap 40. To describe this by citing yet another example, for example in the case of the air gap 40 having on its top an upward convex cone (upper part) united with a cylinder (lower part), the surface which is almost in parallel with the wire 30 on the cross section of the air gap 40 is referred to as the side surface of the air gap 40, the surface which is inclined more than the side surface and in contact with or opposed to the first insulating film 20 on the cross section of the air gap 40 is referred to as the under surface, and the surface which is inclined more than the side surface and in contact with the second insulating film 50 also on the cross section is referred to as the top surface. Further, to restate the top surface in such a case, a place corresponding to the side surface of the cone located in the upper part of the air gap 40 is the top surface. However, the air gaps 40 in a variety of shapes can be formed in the present embodiment as described later, and hence the shape of the air gap 40 is not restricted to the cylindrical shape or the shape of the cone combined with the cylinder. Further in the following description, the top surface of the air gap 40 is made up of two regions which are a central part and a peripheral part, where the central part on the top surface of the air gap 40 refers to a center and the vicinity thereof on the top surface of the air gap 40, and the peripheral part on the top surface of the air gap 40 refers to a region located so as to surround the central part.

In the present embodiment, the air gap 40 is formed between the wires 30 as shown in FIG. 1. Specifically, the peripheral part on the top surface of the air gap 40 is almost as high as that of the top surface of the first layer 321, and the central part on the top surface of the air gap 40 is higher than the peripheral part on the top surface of the air gap 40. In other words, the central part on the top surface of the air gap 40 has a shape protruding upward in an acute form. However, the present embodiment is not restricted to the shape shown in FIG. 1, and at least the top surface of the air gap 40 or the whole top surface thereof (the whole top surface of the air gap 40 refers to the peripheral part and the central part in the following description) may be higher than the top surface of the metal film 31. Therefore, the air gap 40 may, for example, be one having such a shape as follows.

Figure 2D:
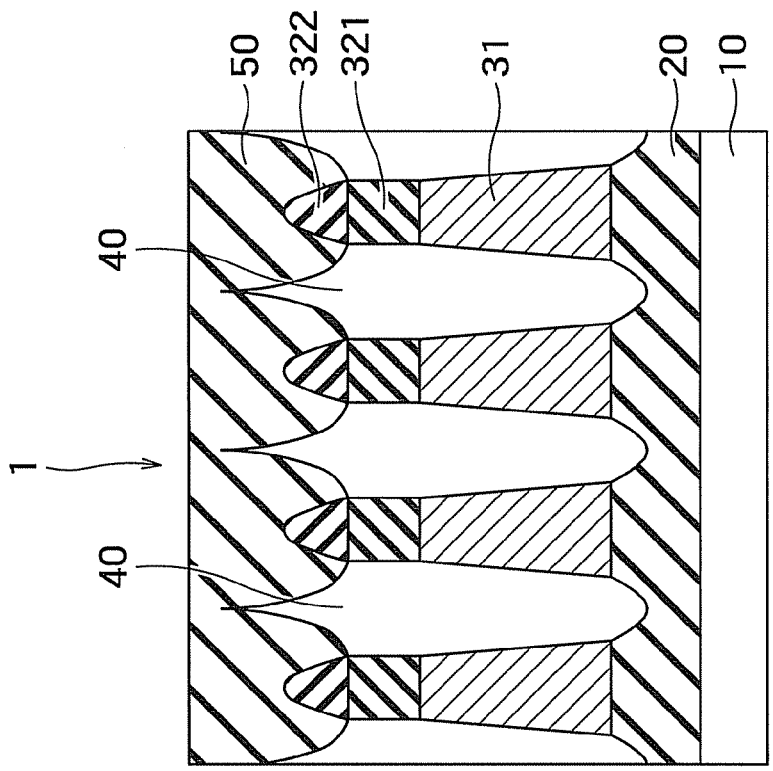
Figure 2C:
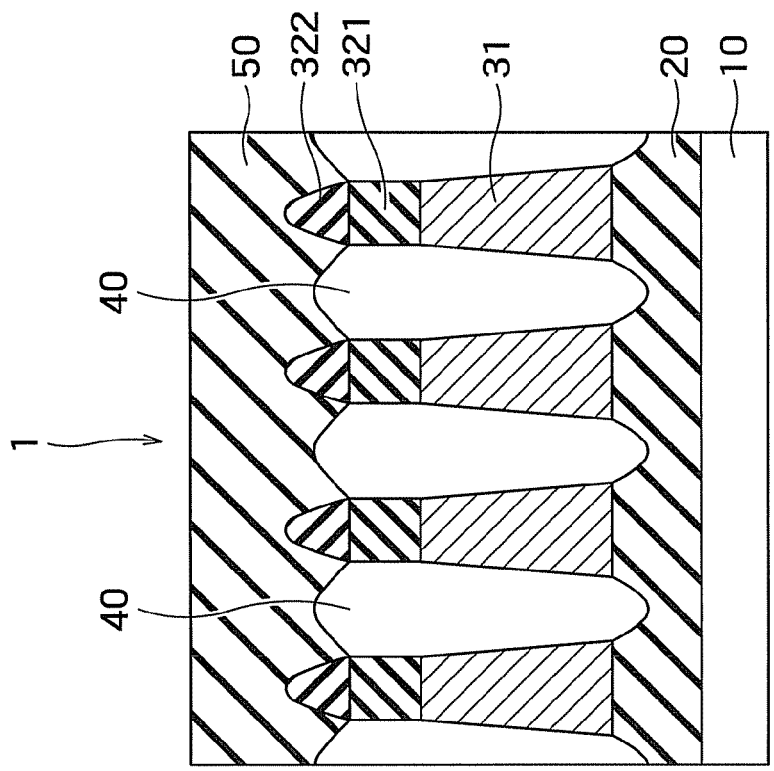
Figure 2E:
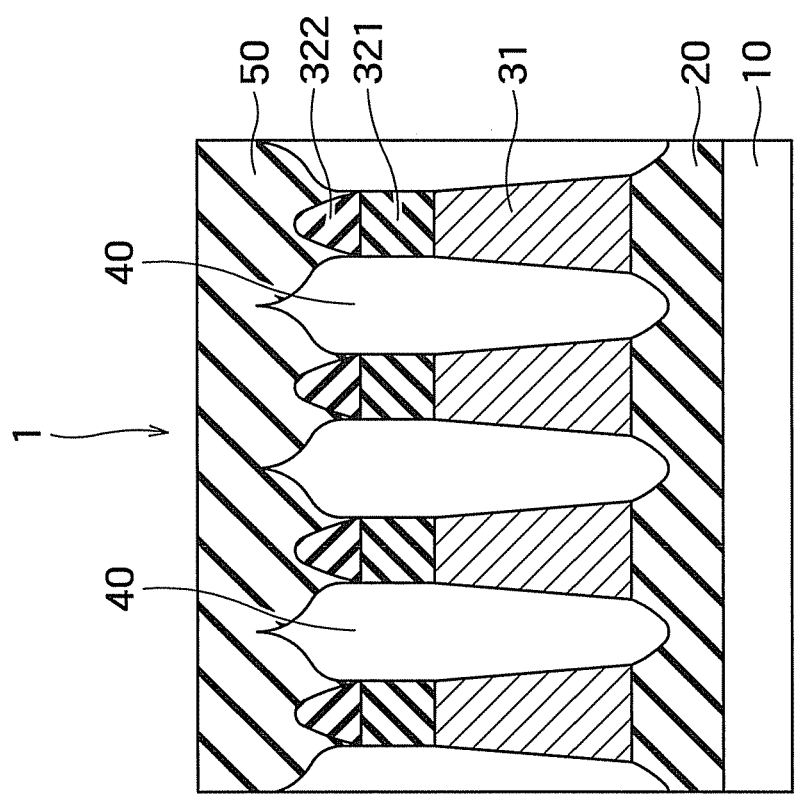

As shown in FIG. 2A, the peripheral part on the top surface of the air gap 40 may be higher than the top surface of the metal film 31 and lower than the top surface of the first layer 321, and further, the central part on the top surface of the air gap 40 may protrude upward in the acute form. Moreover, as shown in FIGS. 2B and 2C, with respect to the central part on the top surface having the shape protruding upward in the acute form in FIG. 1, the same part may have a shape protruding upward in an arc form, or as shown in FIG. 2D, the central part on the top surface may be an extremely acute angle while sides (side surfaces) sandwiching the top of the acute form may have such a shape as being swollen downward. Moreover, as shown in FIG. 2E, on the top surface of the air gap 40, the peripheral part may have such a shape as being almost flat or swollen upward, and the central part may further have such a shape as protruding upward like a very acute needle tip.

Although the shape of the under surface of the air gap 40 is not particularly restricted, it is preferably a downward convex shape as shown in FIG. 1, so as to improve the reliability (leak current characteristics) of the wires 30.

Examples of a material for the first insulating film 20 include $SiO_2$, SiN, SiOC, BN and SiCN.

Examples of a material for the metal film 31 include tungsten, ruthenium, molybdenum, copper, nickel, cobalt, manganese, aluminum, and silicide, alloys and the like of these.

Although the first layer 321 and the second layer 322 can be formed of either the same material or different materials, they are preferably formed of different materials from the viewpoint of ease of processing. It should be noted that examples of the materials for the first layer 321 and the second layer 322 include SiN, SiCN, TiN, AlN, TaN, BN, SiOC and $SiO_2$.

Examples of a material for the second insulating film 50 include $SiO_2$, SiN, SiOC and BN.

Figure 3C:
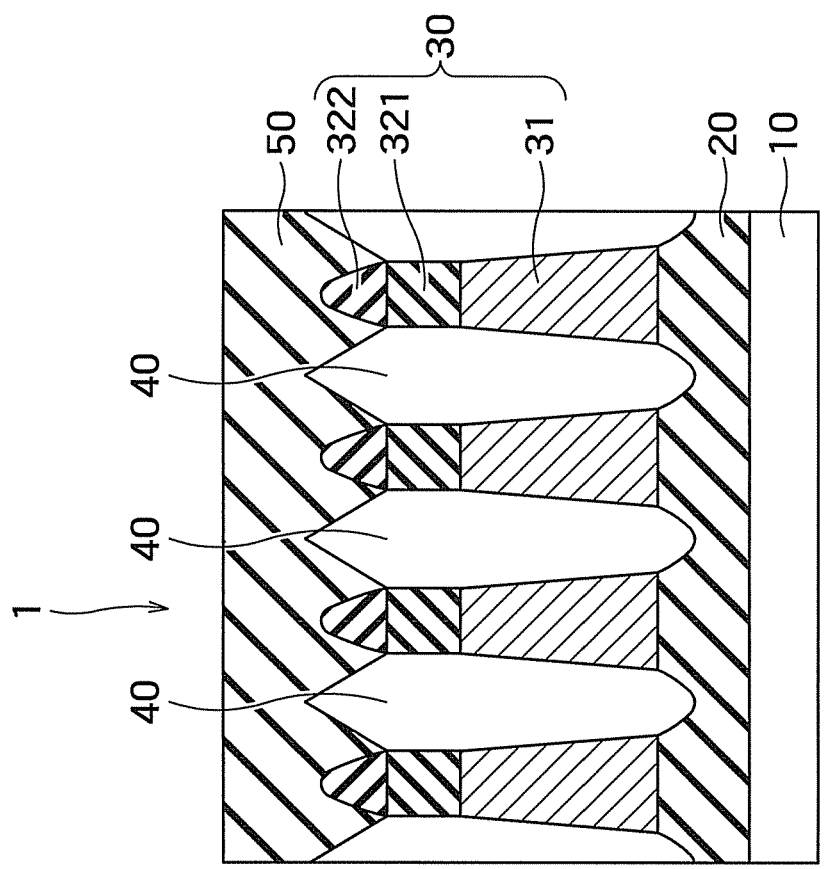

Next, a method for manufacturing the semiconductor device 1 of the present embodiment will be described with reference to FIGS. 3A to 3C. FIGS. 3A to 3C are sectional views in respective manufacturing processes corresponding to FIG. 1, and are specifically ones showing cross sections along the width of the wire 30 formed in the semiconductor device 1. It should be noted that, although a method for forming the wire 30 by use of the RIE (Reactive Ion Etching) method will be described here, the present embodiment is not restricted to this, and the wire 30 may be formed of another method such as the damascene method.

First, the first insulating film 20 made of $SiO_2$, SiN, SiOC, BN, SiCN or the like is formed on the semiconductor substrate 10 by use of a known method. It is to be noted that the semiconductor substrate 10 is not necessarily a silicon substrate, but may be one obtained by forming a structure of a semiconductor element or the like on a variety of substrates as thus described.

Subsequently, the metal film 31 made of tungsten, ruthenium, molybdenum, copper, nickel, cobalt, manganese, aluminum, and silicide, alloys and the like of these is formed on the first insulating film 20 by use of a known method. For example, the metal film 31 is formed so as to have a thickness twice as large as a distance between the later-formed wires 30.

Further, a first film 921 of SiN, SiCN, TiN, AlN, TaN, BN, SiOC, $SiO_2$ or the like, to be a material for the first layer 321, is formed on the metal film 31. The first film 921 is preferably formed so as to have a thickness not smaller than a half of the distance between the later-formed wires 30. At this time used can be the CVD (Chemical Vapor Deposition) method, the PVD (Physical Vapor Deposition) method, the ALD (Atomic Layer Deposition) method or the like.

Further, a second film 922 of SiN, SiCN, TiN, AlN, TaN, BN, SiOC, $SiO_2$ or the like, to be a material for the second layer 322, is formed on the first film 921. Although the second film 922 can be formed of the same material as the first film 921, it is preferably formed of a different material from the viewpoint of ease of processing. Moreover, for example, the second film 922 is formed so as to have a thickness not smaller than a half of the distance between the later-formed wires 30. At this time, as in the formation of the first film 921, the CVD (Chemical Vapor Deposition) method, the PVD (Physical Vapor Deposition) method, the ALD (Atomic Layer Deposition) method or the like can be used.

Further, a litho-stack 60 and a resist 70 for pattern formation are formed on the second film 922. The litho-stack 60 is made of an organic film, SiOC, $SiO_2$ or the like. A desired pattern is formed in the resist 70 by use of the exposure technology such as photolithography, e.g., EUV (Extreme Ultraviolet) lithography. In such a manner, the structure as shown in FIG. 3A can be obtained.

Next, the litho-stack 60 is processed using the patterned resist 70 as a mask, and after the resist 70 is removed, the second film 922, the first film 921 and the metal film 31 are sequentially processed using the RIE method. In the middle of this process, the litho-stack 60 is removed, to allow formation of the wire 30 made up of the metal film 31, the first layer 321 and the second layer 322, as shown in FIG. 3B. Specifically, the second film 922 is etched such that the second layer 322 has a cross section in the shape of a trapezoid with an upper base shorter than a lower base, a triangle, a semicircle with its diameter facing the first layer 321, or the like. The first film 921 is etched such that the first layer 321 has a cross section in the shape of a rectangle, a square, a trapezoid with an upper base shorter than a lower base, or the like. Further, the metal film 31 is etched so as to have a cross section in the shape of a rectangle, a square, a trapezoid with an upper base shorter than a lower base, or the like. At this time, the etching is performed such that the lower base side internal angle $\theta_{322}$ of the second layer 322 is smaller than the lower base side internal angle $\theta_{321}$ of the first layer 321. Further, the etching is preferably performed such that the lower base side internal angle $\theta_{321}$ of the first layer 321 is the same as or larger than the lower base side internal angle $\theta_{31}$ of the metal film 31, and the lower base side internal angle $\theta_{322}$ of the second layer 322 is smaller than the lower base side internal angle $\theta_{31}$ of the metal film 31.

At the time of this processing, a portion of the first insulating film 20, which is exposed from between the metal films 31, and part of a layer located thereunder may be etched. In this case, the under surface of the later-formed air gap 40 has a downward convex shape.

Further, on conditions of a poor coverage, the second insulating film 50 made up of $SiO_2$, SiN, SiOC, BN or the like is formed using the CVD method. In this manner, it is possible to obtain such a semiconductor device 1 as having the air gap 40 between the adjacent wires 30, as shown in FIG. 3C. Specifically, the peripheral part on the top surface of the air gap 40 is almost as high as that of the top surface of the first layer 321, and the central part is higher than the peripheral part on the top surface of the air gap 40. It is to be noted that as described above, the present embodiment is not restricted to obtaining the air gap 40 in such a shape, but it is possible to obtain such an air gap 40, at least, whose top surface (whole) is higher than the top surface of the metal film 31.

As thus described, according to the present embodiment, forming the hard mask 32 into the shape as described above can control the shape of the air gap 40, especially the height of the top surface of the air gap 40. That is, the hard mask 32 is made up of the first layer 321 and the second layer 322, each of the cross sections thereof is formed into a trapezoid or the like, and the lower base side internal angle of the cross section of the second layer 322 is made smaller than the lower base side internal angle of the cross section of the first layer 321, whereby it is possible to make at least the top surface (whole) of the air gap 40 higher than the top surface of the metal film 31, and it is further possible to make the peripheral part on the top surface of the air gap 40 almost as high as the top surface of the first layer 321, and make the central part higher than the peripheral part on the top surface of the air gap 40. Forming the air gap 40 into such a shape can improve the reliability of the wires 30 while reducing the capacitance between the wires 30. A detail thereof will be described below.

First, the height and the shape of the top surface of the air gap 40 will be described. It is known that, when a film is deposited on the substrate by the CVD method, the film is deposited so as to trace the shape of the substrate. Further, when the film is deposited on the condition of forming the air gap 40 between the wires 30, the film is easily deposited on the upper part of the side surface of the wire 30 as compared with the lower part of the side surface thereof because the film is more apt to attach to a portion closer to the top sequentially on the side surface of the wire 30. Moreover, it is known that the film is hardly deposited on a portion of the bottom between the wires 30 (top surface of the first insulating film 20 which is exposed from between the wires 30) due to a high aspect ratio of the wire 30. Therefore, an overhanging-shaped film extending from the upper part of the side surface of the wire 30 is formed over a void located between the wires 30, and a further overhanging-shaped film is formed on that overhanging-shaped film, ultimately covering the void as if being a lid, so as to form the air gap 40.

Further, it is known that, when the air gap 40 is formed by the CVD method, the central part on the top surface of the air gap 40 tends to be located high as compared with the peripheral part on the top surface of the air gap 40.

Figure 4:
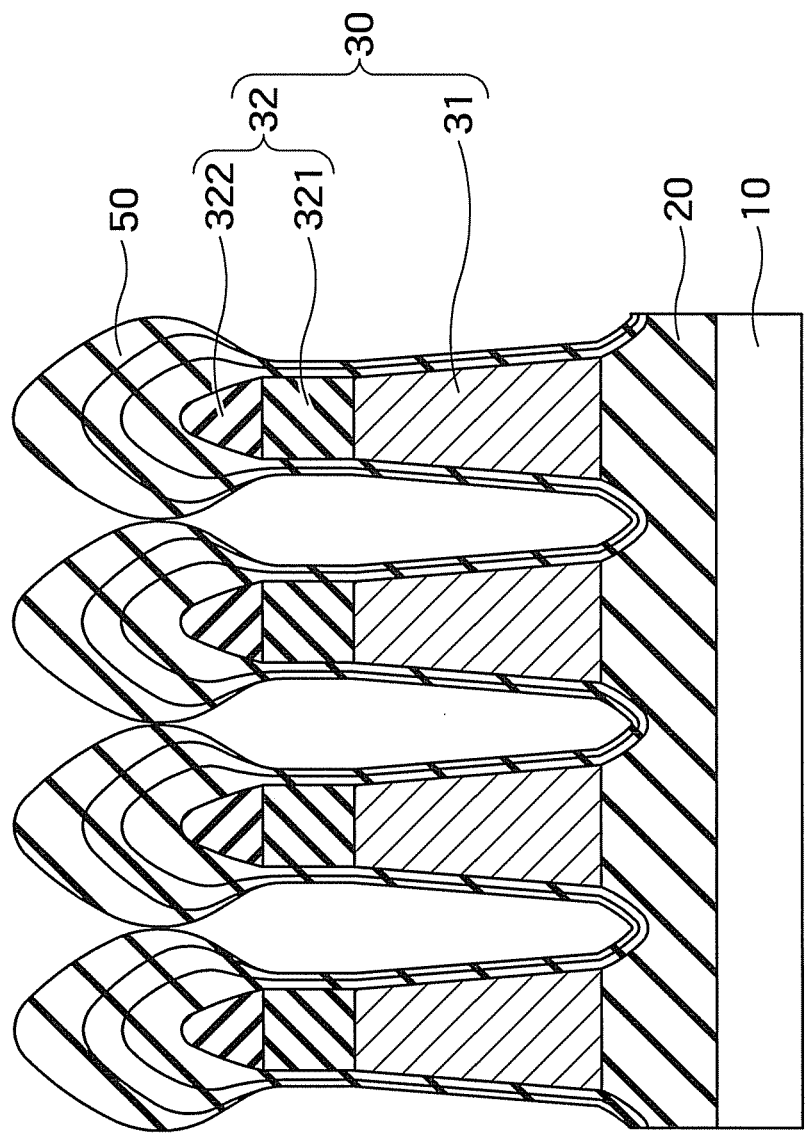
FIGS. 4 and 5 are views for explaining the first embodiment.

On top of the phenomenon as thus described, the present inventor thinks that such a thing as described below has occurred in the present embodiment. That is, as shown in FIG. 4 which shows the process of forming the second insulating film 50 by the CVD method, when the second insulating film 50 is deposited on the hard mask 32 having such a shape as in the present embodiment, it is thought that the second insulating film 50 is hardly deposited on the side surface of the first layer 321 since the side surface of the first layer 321 is steep.

Further, since the lower base side internal angle $\theta_{322}$ of the second layer 322 is formed so as to be smaller than the lower base side internal angle $\theta_{321}$ of the first layer 321, the side surface of the second layer 322 is gently inclined as compared with the side surface of the first layer 321, and hence it is thought that the second insulating film 50 is formed in the overhanging shape on the side surface in the vicinity of the top surface of the first layer 321 (interface of the first layer 321 and the second layer 322). It is thought that the overhanging-shaped second insulating film 50 formed on the side surface in the vicinity of the top surface of the first layer 321 and the further overhanging-shaped second insulating film 50 formed thereon perform covering as if being a lid, so as to form the air gap 40. Since the air gap 40 is formed as thus described, it is thought that the peripheral part on the top surface of the air gap 40 has almost the same height as that of the top surface of the first layer 321.

Figure 11:
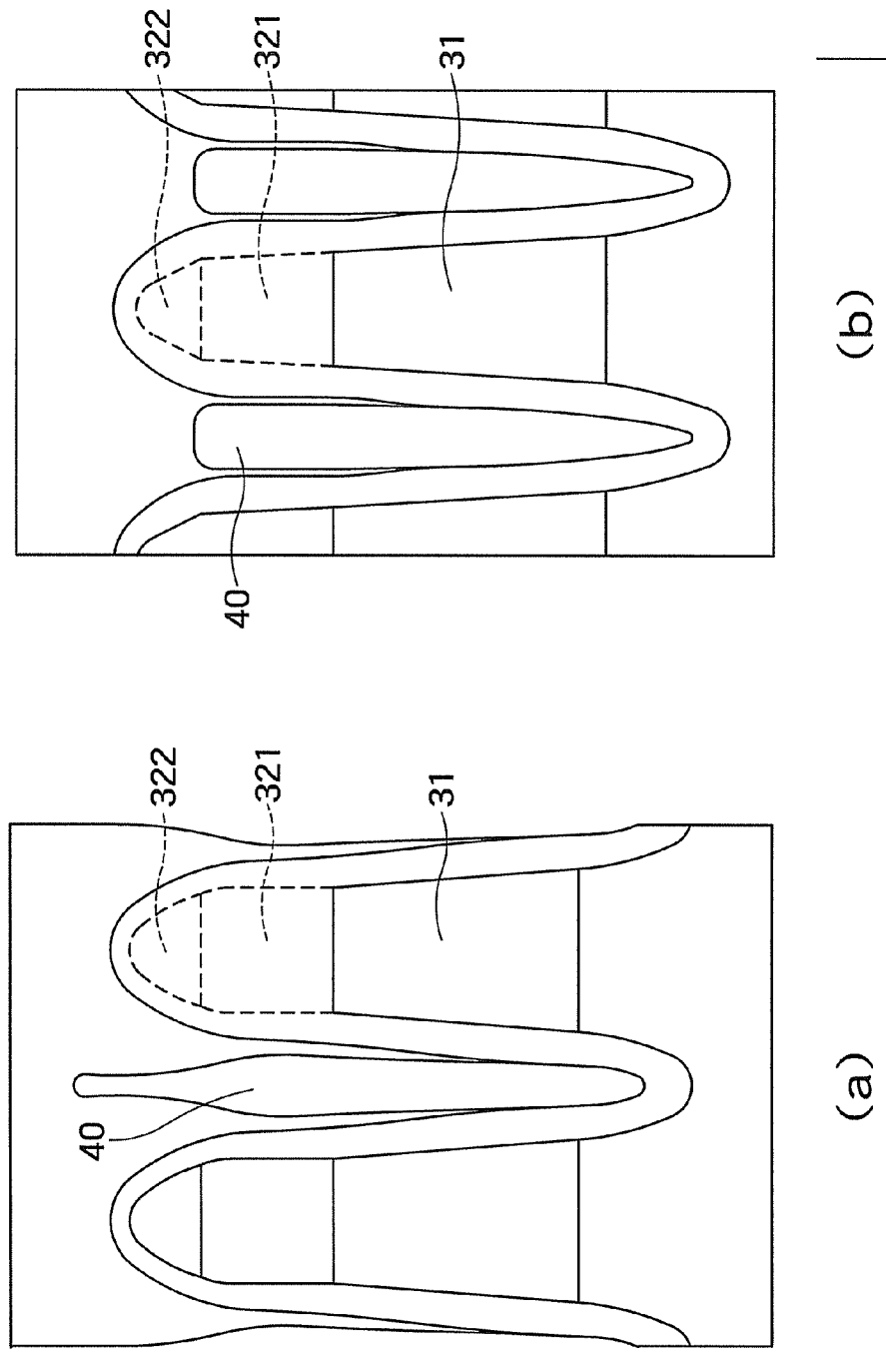
FIGS. 11 (*a*) and 11 (*b*) are sectional views of the semiconductor devices according to the first and second embodiments.

It is to be noted that FIG. 11 (a) shows a sectional view of the semiconductor device 1 obtained by the present embodiment, which was taken using a transmission electron microscope (TEM). As also seen from this view, the peripheral part on the top surface of the air gap 40 is almost as high as that of the top surface of the first layer 321, and the central part is higher than the peripheral part on the top surface of the air gap 40.

It should be noted that in the present embodiment, the lower base side internal angle $\theta_{321}$ of the first layer 321 is preferably the same as or larger than the lower base side internal angle $\theta_{31}$ of the metal film 31, and the lower base side internal angle $\theta_{322}$ of the second layer 322 is preferably smaller than the lower base side internal angle $\theta_{31}$ of the metal film 31. As thus described, by forming the lower base side internal angle $\theta_{321}$ of the first layer 321 so as to be larger than the lower base side internal angle $\theta_{31}$ of the metal film 31, the difference in angles between the lower base side internal angle $\theta_{321}$ of the first layer 321 and the lower base side internal angle $\theta_{322}$ of the second layer 322 can be made large. In other words, the difference in inclination of the side surface between the first layer 321 and the second layer 322 can be made large, which can bring the second insulating film 50 into the state of being more apt to be deposited on the side surface of the second layer 322 than on the side surface of the first layer 321. Similarly, by forming the lower base side internal angle $\theta_{321}$ of the first layer 321 so as to be the same or larger than the lower base side internal angle $\theta_{31}$ of the metal film 31, and by further forming the lower base side internal angle $\theta_{322}$ of the second layer 322 so as to be smaller than the lower base side internal angle $\theta_{31}$ of the metal film 31, a difference in angles between the lower base side internal angle $\theta_{321}$ of the first layer 321 and the lower base side internal angle $\theta_{322}$ of the second layer 322 can be made large. In other words, a difference in inclination of the side surface between the first layer 321 and the second layer 322 can be made large, which can bring the second insulating film 50 into the state of being more apt to be deposited on the side surface of the second layer 322 than on the side surface of the first layer 321.

Figure 5:
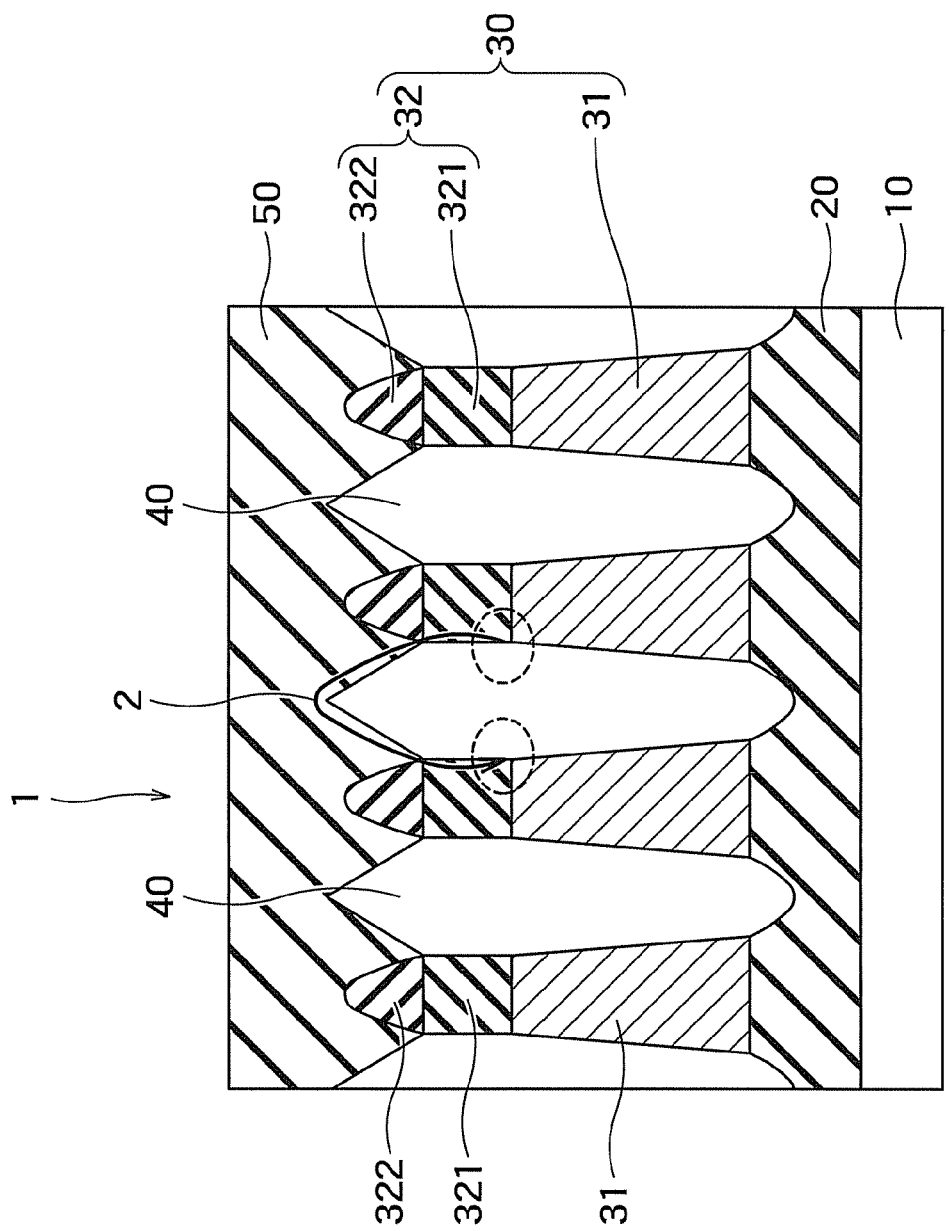

Next, the reliability of the wires 30 will be described. When the electric field is applied to between the wires 30, an electric field is strongly applied to a corner (e.g., region surrounded by a dotted line in FIG. 5) of the metal film 31. When a highly strong electric field is applied, therefore, a leak current occurs between the corners of the adjacent metal films 31. Then, as shown as an arrow of numeral 2 in FIG. 5, this leak current has a property of flowing along the boundary surface between the air gap 40 and the second insulating film 50 rather than flowing in the air gap 40. In the present embodiment, therefore, the top surface (whole) of the air gap 40 is higher than the top surface of the metal film 31, and hence a path 2 of the leak current is longer than the distance between the adjacent wires 30. Accordingly, with this distance being longer, the electric field strength is reduced and the leak current becomes more resistant to flow, whereby it is possible to improve such leak current characteristics of the wire 30 as becoming resistant to occurrence of temporal destruction (TDDB), and further to improve the reliability of the wires 30.

Moreover, in the present embodiment, since the top surface (whole) of the air gap 40 is higher than the top surface of the metal film 31, the thickness of the first layer 321 can be made not smaller than a half of the distance between the adjacent wires 30, thereby to form the wire 30 using the damascene method, and make the length of the leak current path not less than twice as large as that in a case (Comparative Example) where the top surface (whole) of the air gap 40 is as high as the top surface of the metal film 31. Accordingly, even when the same voltage is applied from the outside into between the wires 30, actual electric field strength inside the semiconductor device 1 in the present embodiment is not larger than a half of that in the comparative example, thereby allowing significant suppression of a value of the leak current itself. Depending on the material used for the second insulating film 50, the leak current can be suppressed by as large as the order of two digits.

Further, in the present embodiment, since the second insulating film 50 is formed using the CVD method, the central part tends to be higher than the peripheral part on the top surface of the air gap 40 as described above, and hence the leak current path can be made longer, which is thought to be more effective in improvement in characteristics of the leak current between the wires 30.

As also seen from the descriptions so far, as compared with the semiconductor device 1 of FIG. 2A, the semiconductor device 1 of FIG. 1 is preferred due to its leak current path being long, and as compared with, the semiconductor device 1 of FIG. 2C, the semiconductor device 1 of FIG. 2B is preferred due to its leak current path being long.

That is, according to the present embodiment, forming the hard mask 32 into a desired shape can control the shape of the air gap 40, so as to improve the reliability of the wires 30 while reducing the capacitance between the wires 30.

Further, in the present embodiment, the shape of the air gap 40 is controlled by the hard mask 32 which has conventionally been used as a mask at the time of forming the wire 30 by use of the RIE method, thereby eliminating the need for significantly changing the conventionally used manufacturing process.

Then in the present embodiment, since the second insulating film 50 is formed using the CVD method which can be performed even at a low temperature, the formation can be performed also on the semiconductor device 1 including an element which might deteriorate due to a high temperature.

Figure 6:
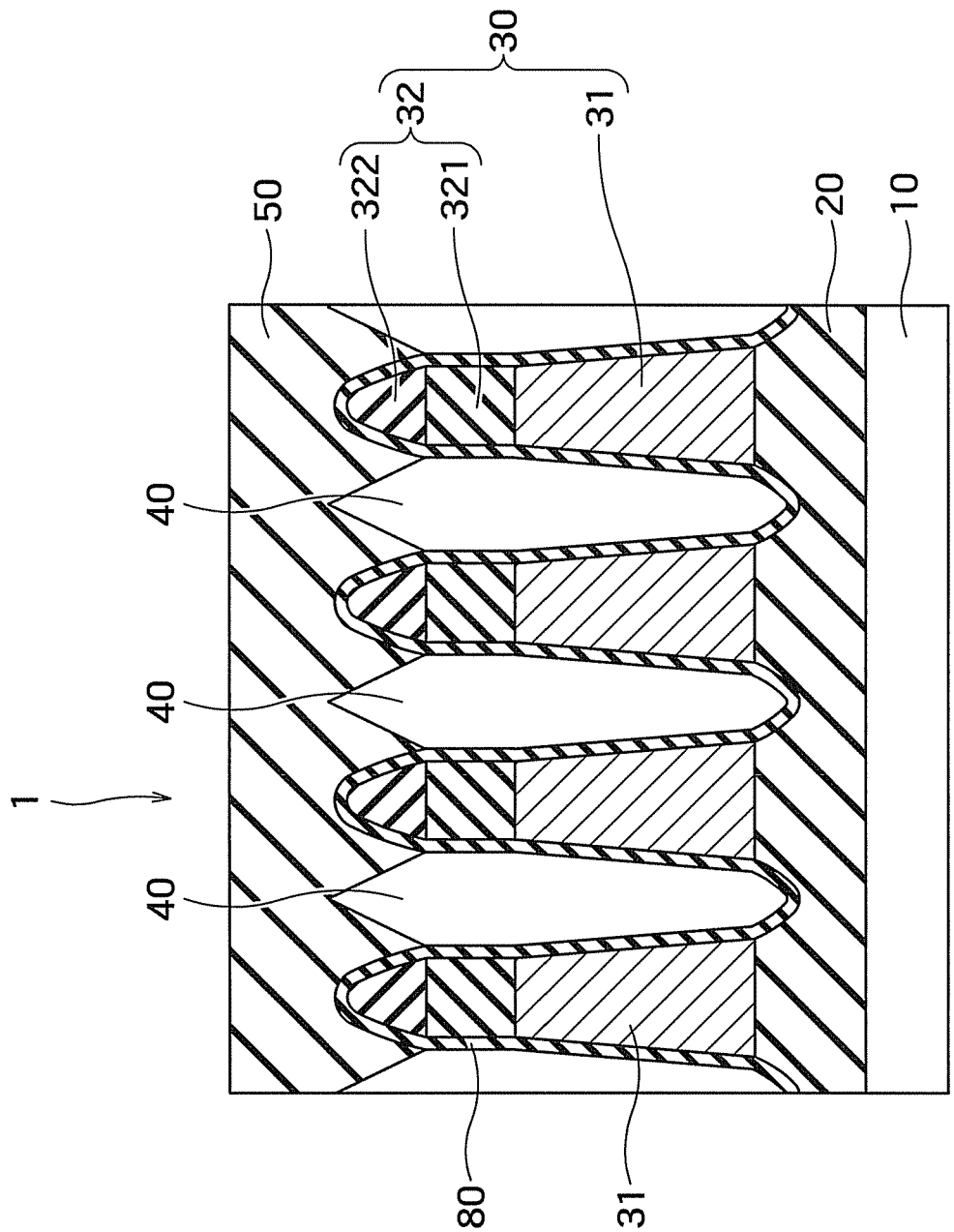
FIG. 6 is a sectional view (part 2) of a modified example of the semiconductor device according to the first embodiment.

It is to be noted that as shown in FIG. 6, the wire 30 may be covered by a cover film 80 for protecting the wire 30. In this case, before formation of the second insulating film 50, the cover film 80, which is made of $SiO_2$, SiN, SiOC, BN or the like and has a film thickness of not larger than 5 nm, is formed using the CVD method or the ALD method.

Second Embodiment

A second embodiment is different from the first embodiment in that the second insulating film 50 is formed by the SOD (Spin On Dielectric) method. With the SOD method having high in-plane uniformity, it is possible to improve the yield in manufacturing the semiconductor device 1.

Hereinafter, the semiconductor device according to the present embodiment will be described using FIG. 7 which shows a cross section of the semiconductor device of the present embodiment. Herein, a portion having the same configuration and function as in the first embodiment is provided with the same numeral, and a description thereof will be omitted. Similarly to the first embodiment, although an example of application to multi-layered wires of a semiconductor storage device will be described, the present invention is not restricted thereto.

Figure 7:
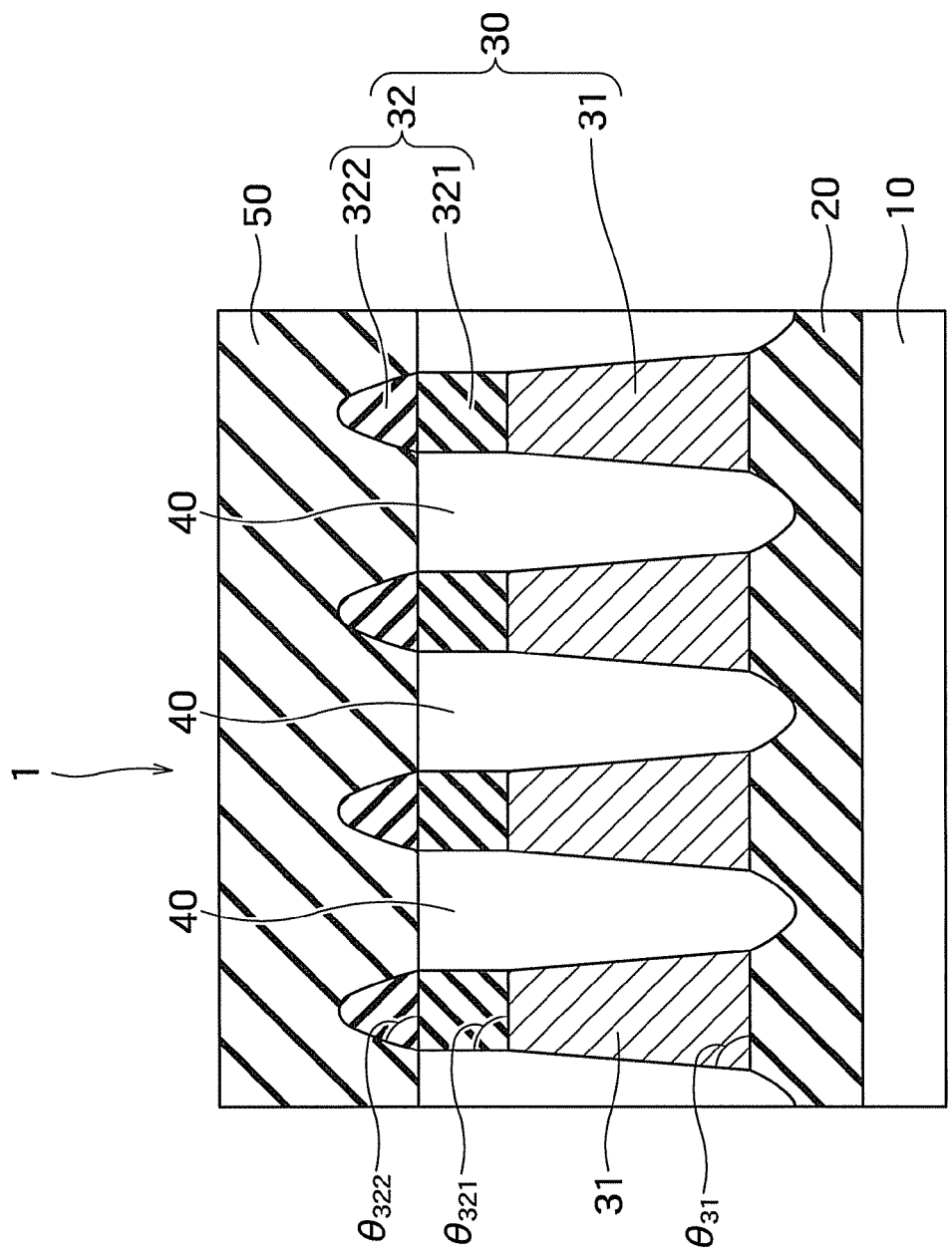
FIG. 7 is a sectional view of a semiconductor device according to a second embodiment.

FIG. 7 shows the cross section of the semiconductor device 1 in the present embodiment, and is specifically one showing a cross section along the width of the wire 30 formed in the semiconductor device 1. As shown in FIG. 7, similarly to the first embodiment, the plurality of wires 30 is arranged on the first insulating film 20 formed above the semiconductor substrate 10, and the air gap 40 is formed between the adjacent wires 30. Further, the second insulating film 50 is formed on each wire 30 and each air gap 40.

Similarly to the first embodiment, each wire 30 has the metal film 31 formed on the first insulating film 20, and the hard mask 32 formed on the metal film 31, and the hard mask 32 is made up of the first layer 321 and the second layer 322. Similarly to the first embodiment, although the hard mask 32 will be described as one having a double-layered structure in the present embodiment, this is not restrictive.

Similarly to the first embodiment, the metal film 31 has a cross section in the shape of a rectangle, a square, a trapezoid with an upper base shorter than a lower base, or the like, or in the shape similar thereto. It is to be noted that as described above, the metal film 31 preferably has a cross section in the shape of the trapezoid. Further, the first layer 321 has a cross section in the shape of a rectangle, a square, a trapezoid with an upper base shorter than a lower base, or the like, or a shape similar thereto, and the second layer 322 has a cross section in the shape of a trapezoid with an upper base shorter than a lower base, a triangle, a semicircle with its diameter facing the first layer 321, or the like, or in the shape similar thereto. Also in the present embodiment, the lower base side internal angle $\theta_{322}$ of the second layer 322 is smaller than the lower base side internal angle $\theta_{321}$ of the first layer 321. Further, the lower base side internal angle $\theta_{321}$ of the first layer 321 is preferably the same as or larger than the lower base side internal angle $\theta_{31}$ of the metal film 31, and the lower base side internal angle $\theta_{322}$ of the second layer 322 is preferably smaller than the lower base side internal angle $\theta_{31}$ of the metal film 31.

In the present embodiment, as shown in FIG. 7, the top surface (whole) of the air gap 40 is almost as high as the top surface of the first layer 321, and has almost a flat shape.

Figure 8A:
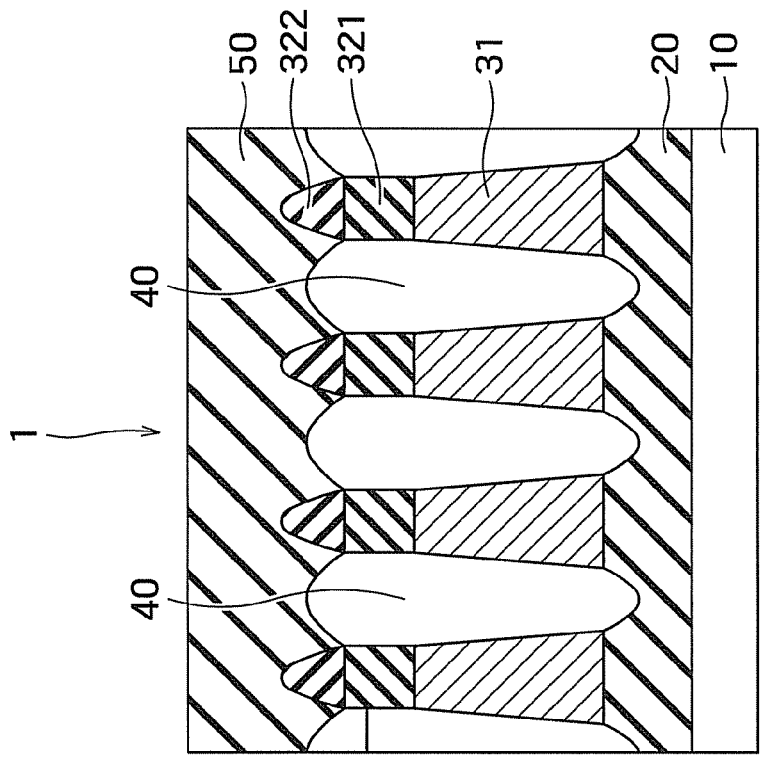
FIGS. 8A to 8C are sectional views (part 1) of modified examples of the semiconductor device according to the second embodiment.
Figure 8B:
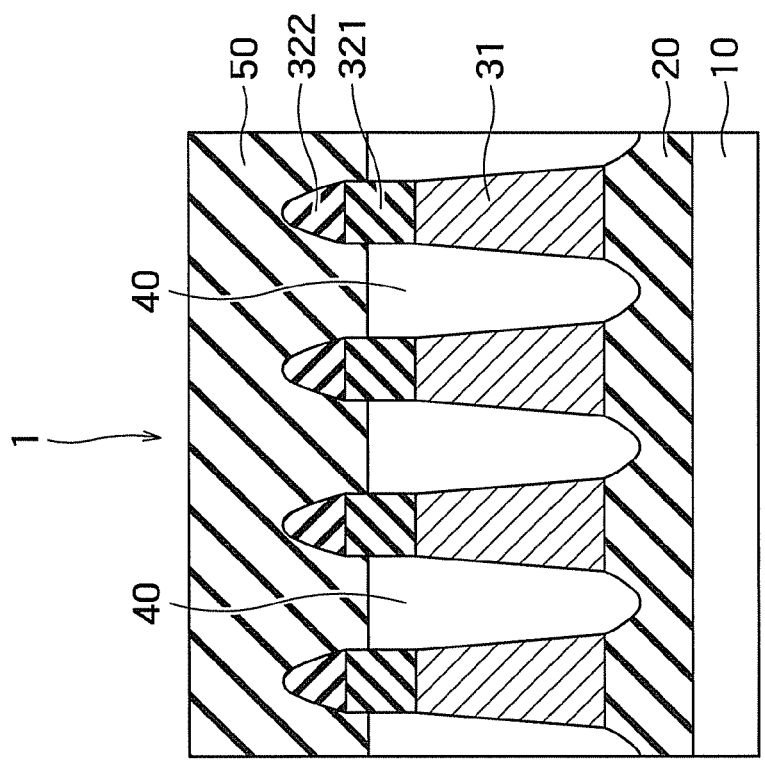
Figure 8C:
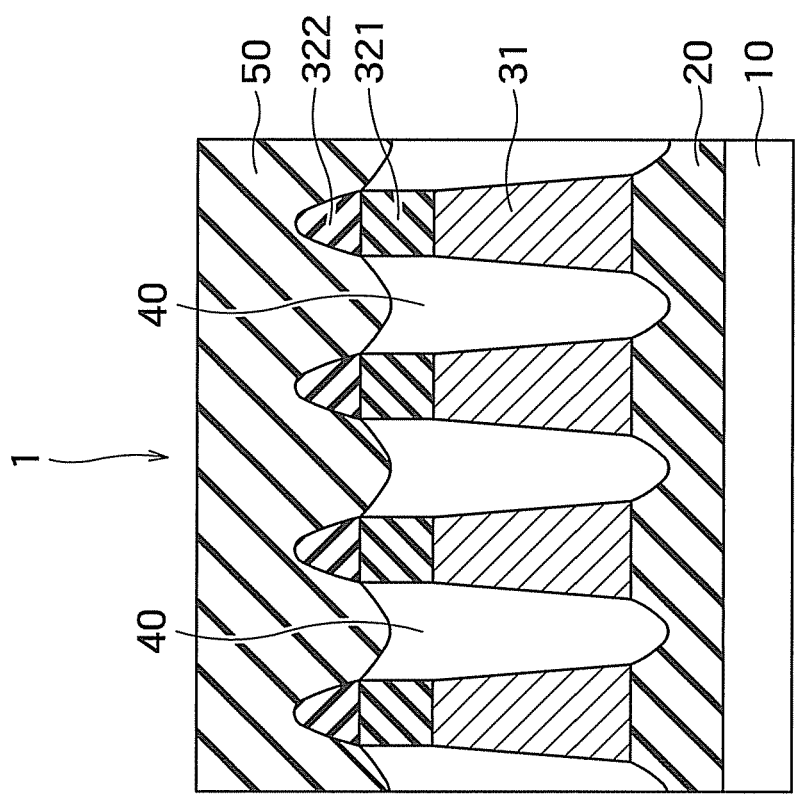

However, the present embodiment is not restricted to the shape shown in FIG. 7, and at least the top surface (whole) of the air gap 40 may be higher than the top surface of the metal film 31, as shown in FIG. 8A. Further, for example as shown in FIG. 8B, the central part may be higher than the peripheral part on the top surface of the air gap 40, and as shown in FIG. 8C, the central part may be lower than the peripheral part.

For the second insulating film 50, $SiO_2$, SiOC or the like can be used. It is to be noted that, since a dielectric constant is low, it is preferable to use SiOC from the viewpoint of reducing the capacitance.

Next, a method for manufacturing the semiconductor device 1 of the present embodiment will be described with reference to FIGS. 9A and 9B. FIGS. 9A and 9B are sectional views in respective manufacturing processes corresponding to FIG. 7, and are specifically ones showing cross sections along the width of the wire 30 formed in the semiconductor device 1. It should be noted that, although a method for forming the wire 30 by use of the RIE method will be described here, the present embodiment is not restricted to this.

First, similarly to the processes shown in FIGS. 3A and 3B in the manufacturing method of the first embodiment, a plurality of wires 30 each having a desired shape is formed on the first insulating film 20 on the semiconductor substrate 10. Specifically, the wire 30 made up of the metal film 31, the first layer 321 and the second layer 322 as shown in FIG. 9A can be obtained by being processed into a similar shape to in the first embodiment, by use of the RIE method.

Then using the SOD method, specifically by applying a solution to be the material for the second insulating film 50 to the top surface of the second layer 322 and heating it, the second insulating film 50 made of $SiO_2$, SiOC or the like is formed. In this manner, it is possible to obtain such a semiconductor device 1 as having the air gap 40 between the adjacent wires 30, as shown in FIG. 9B. Specifically, it is possible to obtain the air gap 40 whose top surface (whole) is almost as high as the top surface of the first layer 321, and has almost a flat shape. It is to be noted that the present embodiment is not restricted to obtaining the air gap 40 in such a shape, but it is possible to obtain such an air gap 40, at least, whose top surface (whole) is higher than the top surface of the metal film 31.

As thus described, according to the present embodiment, similarly to the first embodiment, forming the hard mask 32 into the shape as described above can make at least the top surface (whole) of the air gap 40 higher than the top surface of the metal film 31, and it is further possible to make the top surface (whole) of the air gap 40 as high as the top surface of the first layer 321, and make the top surface of the air gap 40 almost flat. Forming the air gap 40 into such a shape can improve the reliability of the wires 30 while reducing the capacitance between the wires 30.

In addition, the present inventor thinks that in the present embodiment, when a solution to be the material for the second insulating film 50 is applied onto the hard mask 32 having such a shape as described above and it is then coagulated, surface tension of the coagulated film acts, thereby to make the top surface (whole) of the air gap 40 almost as high as the top surface of the first layer 321.

It is to be noted that FIG. 11 (*b*) shows a sectional view of the semiconductor device 1 obtained by the present embodiment, which was taken using the TEM. As also seen from this view, the top surface (whole) of the air gap 40 has almost the same level of height as the top surface of the first layer 321.

Also in the present embodiment, similarly to the first embodiment, the top surface (whole) of the air gap 40 is higher than the top surface of the metal film 31, and hence the leak current path is longer than the distance between the adjacent wires 30. Since the electric field strength is thereby reduced, it is possible to improve the leak current characteristics of the wire 30, and further to improve the reliability of the wires 30.

Moreover, in the present embodiment, the shape of the air gap 40 is controlled by the hard mask 32 which is a mask used at the time of forming the wire 30 by use of the RIE method, thereby eliminating the need for significantly changing the conventionally used manufacturing process. Since the second insulating film 50 is then formed by the SOD method having high inner-face uniformity, it is possible to expect improvement in yield in manufacturing the semiconductor device 1.

Figure 10:
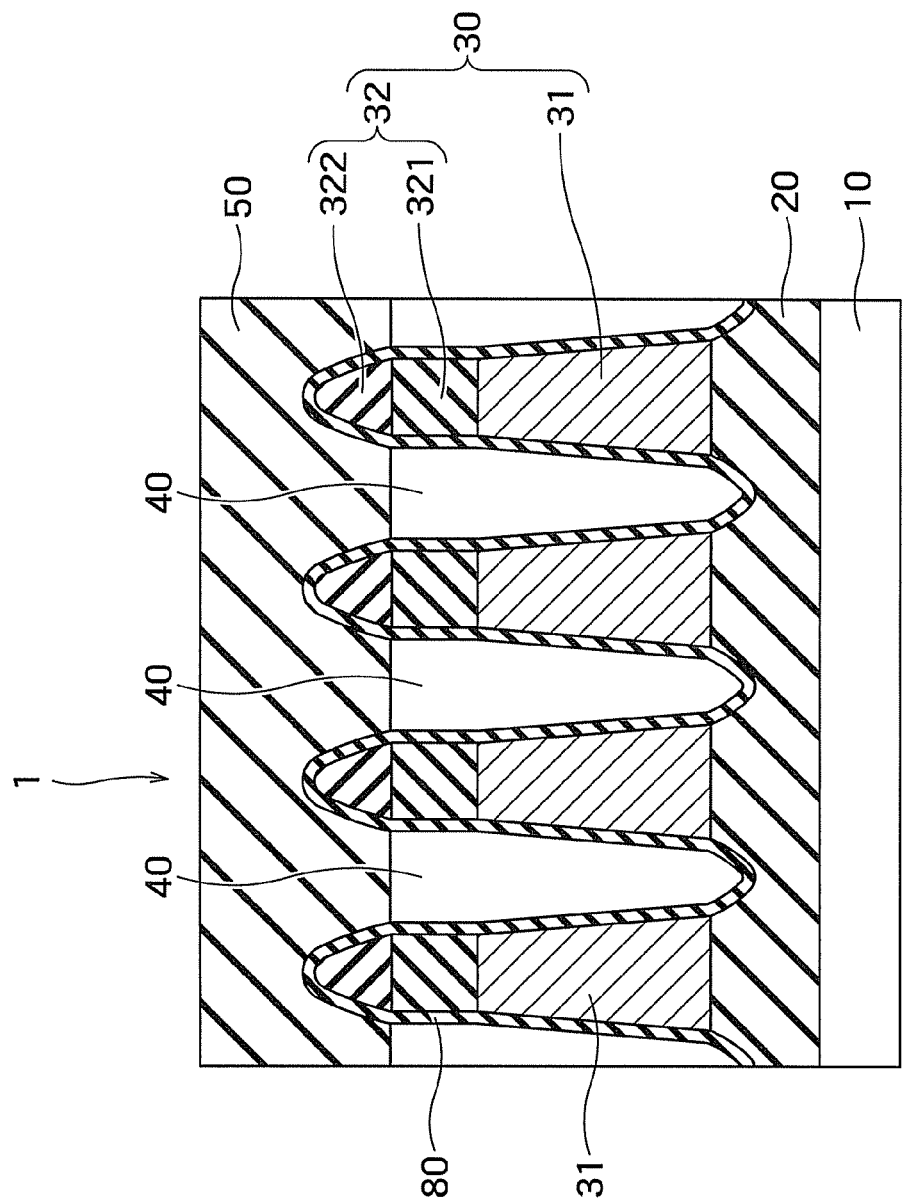
FIG. 10 is a sectional view (part 2) of a modified example of the semiconductor device according to the second embodiment.

It is to be noted that, as shown in FIG. 10, similarly to the first embodiment, the wire 30 may be covered by the cover film 80 for protecting the wire 30. In this case, it is formed similarly to the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first insulating film formed above a semiconductor substrate;
   a plurality of wires formed on the first insulating film, each of the wires comprising a metal film formed on the first insulating film and a hard mask formed on the metal film;
   an air gap formed between adjacent ones of the wires; and
   a second insulating film formed on the wires and the air gap;
   wherein:
   the hard mask of each of the wires comprises a first layer formed on the metal film and a second layer formed on the first layer, such that the semiconductor device comprises a plurality of first layers and a plurality of second layers respectively formed on the first layers, the first layers of the wires being separated from each other, and the second layers of the wires being separated from each other;
   a second internal angle formed by an under surface and a side surface of the second layer on a cross section of the second layer along a width of the wire is smaller than a first internal angle formed by an under surface and a side surface of the first layer on a cross section of the first layer along the width of the wire; and
   a top surface of the air gap is higher than a top surface of the metal film.

2. The semiconductor device according to claim 1, wherein the cross section of the first layer has a shape of a rectangle, a square, or a trapezoid with an upper base shorter than a lower base, and the cross section of the second layer has a shape of a trapezoid with an upper base shorter than a lower base, a shape of a triangle, or a shape with an upper arc and a lower base.

3. The semiconductor device according to claim 2, wherein a cross section of the metal film along the width of the wire has a shape of a rectangle, a square, or a trapezoid with an upper base shorter than a lower base.

4. The semiconductor device according to claim 1, wherein the second internal angle is smaller than a third internal angle formed by an under surface and a side surface of the metal film on a cross section of the metal film along the width of the wire, and the first internal angle is the same as or larger than the third internal angle.

5. The semiconductor device according to claim 1, wherein a peripheral part of the top surface of the air gap is as high as a top surface of the first layer.

6. The semiconductor device according to claim 5, wherein a central part of the top surface of the air gap is higher than the peripheral part of the top surface of the air gap.

7. The semiconductor device according to claim 6, wherein the central part of the to surface of the air gap protrudes in an acute form toward the second insulating film.

8. The semiconductor device according to claim 6, wherein the central part of the to surface of the air gap protrudes in an arc form toward the second insulating film.

9. The semiconductor device according to claim 1, wherein a peripheral part of the to surface of the air gap is higher than a central part of the to surface of the air gap.

10. The semiconductor device according to claim 1, wherein the top surface of the air gap is flat.

11. The semiconductor device according to claim 1, wherein the first layer and the second layer are made of different materials.

12. The semiconductor device according to claim 1, wherein the first layer and the second layer are made of a same material.

13. The semiconductor device according to claim 1, wherein the first layer and the second layer are each made of any of SiN, SiCN, TiN, AlN, TaN, BN, SiOC and SiO$_2$ films.

14. The semiconductor device according to claim 1, wherein the plurality of wires are spaced apart from one another by a predetermined distance, and the first layer has a thickness not smaller than a half of the predetermined distance.

15. The semiconductor device according to claim 1, wherein an under surface of the air gap has a convex shape toward the semiconductor substrate.

16. The semiconductor device according to claim 1, wherein the plurality of wires are covered by a cover film.

17. The semiconductor device according to claim 1, wherein a height of a lower end of the second insulating film is higher than a height of a lower end of the first layer and lower than a height of an upper end of the second layer.

18. A method for manufacturing a semiconductor device including a plurality of wires each having a metal film and a hard mask made up of a first layer and a second layer, and a plurality of air gaps between each of the adjacent wires, the method comprising:
    forming a first insulating film on a semiconductor substrate;
    sequentially forming the metal film, a material film of the first layer and a material film of the second layer on the first insulating film;
    etching the metal film, the material film of the first layer and the material film of the second layer, to make a second internal angle smaller than a first internal angle, the second internal angle being formed by an under surface and a side surface of the second layer on a cross section of the second layer along a width of the wire, and the first internal angle being formed by an under surface and a side surface of the first layer on a cross section of the first layer along the width of the wire; and forming a second insulating film on the second layer to make the air gap between each of the adjacent wires.

19. The method according to claim 18, wherein the second insulating film is formed by using a chemical vapor deposition (CVD) method.

20. The method according to claim 18, wherein the second insulating film is formed by using a spin on dielectric (SOD) method.

21. The method according to claim 18, further comprising etching the first insulating film exposed from the metal film.

* * * * *